(12) United States Patent
Huang et al.

(10) Patent No.: US 12,183,809 B2
(45) Date of Patent: Dec. 31, 2024

(54) MANUFACTURING METHOD OF SEMICONDUCTOR DEVICE

(71) Applicant: UNITED MICROELECTRONICS CORP., Hsin-Chu (TW)

(72) Inventors: Wei-Lun Huang, Tainan (TW); Chia-Ling Wang, Yunlin County (TW); Chia-Wen Lu, Tainan (TW); Ta-Wei Chiu, Changhua County (TW); Ping-Hung Chiang, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 415 days.

(21) Appl. No.: 17/673,819

(22) Filed: Feb. 17, 2022

(65) Prior Publication Data
US 2023/0231035 A1    Jul. 20, 2023

(30) Foreign Application Priority Data
Jan. 20, 2022   (CN) .............................. 202210064952

(51) Int. Cl.
*H01L 29/66* (2006.01)
*H01L 21/8234* (2006.01)
*H01L 29/40* (2006.01)
*H01L 29/423* (2006.01)

(52) U.S. Cl.
CPC ............ *H01L 29/66704* (2013.01); *H01L 21/823462* (2013.01); *H01L 29/401* (2013.01); *H01L 29/42364* (2013.01)

(58) Field of Classification Search
CPC ......... H01L 29/66704; H01L 29/66621; H01L 29/42364; H01L 21/823462; H01L 21/823418
See application file for complete search history.

(56) References Cited

U.S. PATENT DOCUMENTS

| | | | |
|---|---|---|---|
| 9,716,139 B2 | 7/2017 | Chen | |
| 10,276,710 B1 | 4/2019 | Li | |
| 11,404,305 B1* | 8/2022 | Chiu | ................ H01L 21/31105 |
| 2013/0344678 A1* | 12/2013 | Oh | .................... H01L 21/76224 |
| | | | 438/427 |
| 2018/0102408 A1* | 4/2018 | Hsiung | ............... H01L 29/0649 |
| 2022/0139711 A1* | 5/2022 | Lu | ..................... H01L 21/28185 |
| | | | 438/167 |
| 2022/0376071 A1* | 11/2022 | Tsai | .................... H01L 29/0847 |
| 2023/0062058 A1* | 3/2023 | Zhang | ............. H01L 21/823462 |

* cited by examiner

*Primary Examiner* — Edward Chin
(74) *Attorney, Agent, or Firm* — Winston Hsu

(57) ABSTRACT

A manufacturing method of a semiconductor device includes the following steps. A first recess and a second recess are formed in a first region and a second region of a semiconductor substrate, respectively. A bottom surface of the first recess is lower than a bottom surface of the second recess in a vertical direction. A first gate oxide layer and a second gate oxide layer are formed concurrently. At least a portion of the first gate oxide layer is formed in the first recess, and at least a portion of the second gate oxide layer is formed in the second recess. A removing process is performed for removing a part of the second gate oxide layer. A thickness of the second gate oxide layer is less than a thickness of the first gate oxide layer after the removing process.

17 Claims, 16 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device, and more particularly, to a manufacturing method of a semiconductor device including forming a gate oxide layer in a recess.

2. Description of the Prior Art

Double-diffused MOS (DMOS) transistor devices have drawn much attention in power devices having high voltage capability. The conventional DMOS transistor devices are categorized into vertical double-diffused MOS (VDMOS) transistor device and lateral double-diffused MOS (LDMOS) transistor device. Having advantage of higher operational bandwidth, higher operational efficiency, and convenience to be integrated with other integrated circuit due to its planar structure, LDMOS transistor devices are prevalently used in high operation voltage environment such as CPU power supply, power management system, AC/DC converter, and high-power or high frequency band power amplifier. In addition, required electrical performance under some specific high voltage operations may be obtained by adjusting a thickness of a gate oxide layer in a transistor structure. However, the manufacturing complexity may be increased when gate oxide layers with different thicknesses have to be formed on the same wafer, and the manufacturing cost and/or the manufacturing yield will be influenced accordingly. Therefore, the designs of structures and/or manufacturing processes of transistor structures corresponding to different operation voltages have to be integrated for matching product specifications, reducing manufacturing cost, and/or enhancing manufacturing yield.

SUMMARY OF THE INVENTION

A manufacturing method of a semiconductor device is provided in the present invention. Gate oxide layers corresponding to different transistor structures are formed concurrently on a semiconductor substrate, and a removing process is performed for adjusting a thickness of the gate oxide layer on a specific region. The manufacturing processes of different transistor structures may be integrated accordingly, and the purposes of process simplification and/or manufacturing yield enhancement may be achieved.

According to an embodiment of the present invention, a manufacturing method of a semiconductor device is provided. The manufacturing method includes the following steps. A first recess is formed in a first region of a semiconductor substrate, and a second recess is formed in a second region of the semiconductor substrate. A bottom surface of the first recess is lower than a bottom surface of the second recess in a vertical direction. A first gate oxide layer and a second gate oxide layer are formed concurrently. At least a portion of the first gate oxide layer is formed in the first recess, and at least a portion of the second gate oxide layer is formed in the second recess. A removing process is performed for removing a part of the second gate oxide layer. A thickness of the second gate oxide layer is less than a thickness of the first gate oxide layer after the removing process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-14 are schematic drawings illustrating a manufacturing method of a semiconductor device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, FIG. 11 is a schematic drawing in a step subsequent to FIG. 10, FIG. 12 is a schematic drawing in a step subsequent to FIG. 11, FIG. 13 is a schematic drawing in a step subsequent to FIG. 12, and FIG. 14 is a schematic drawing in a step subsequent to FIG. 13.

FIGS. 15 and 16 are schematic drawings illustrating a manufacturing method of a semiconductor device according to a second embodiment of the present invention, wherein FIG. 16 is a schematic drawing in a step subsequent to FIG. 15.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 12:
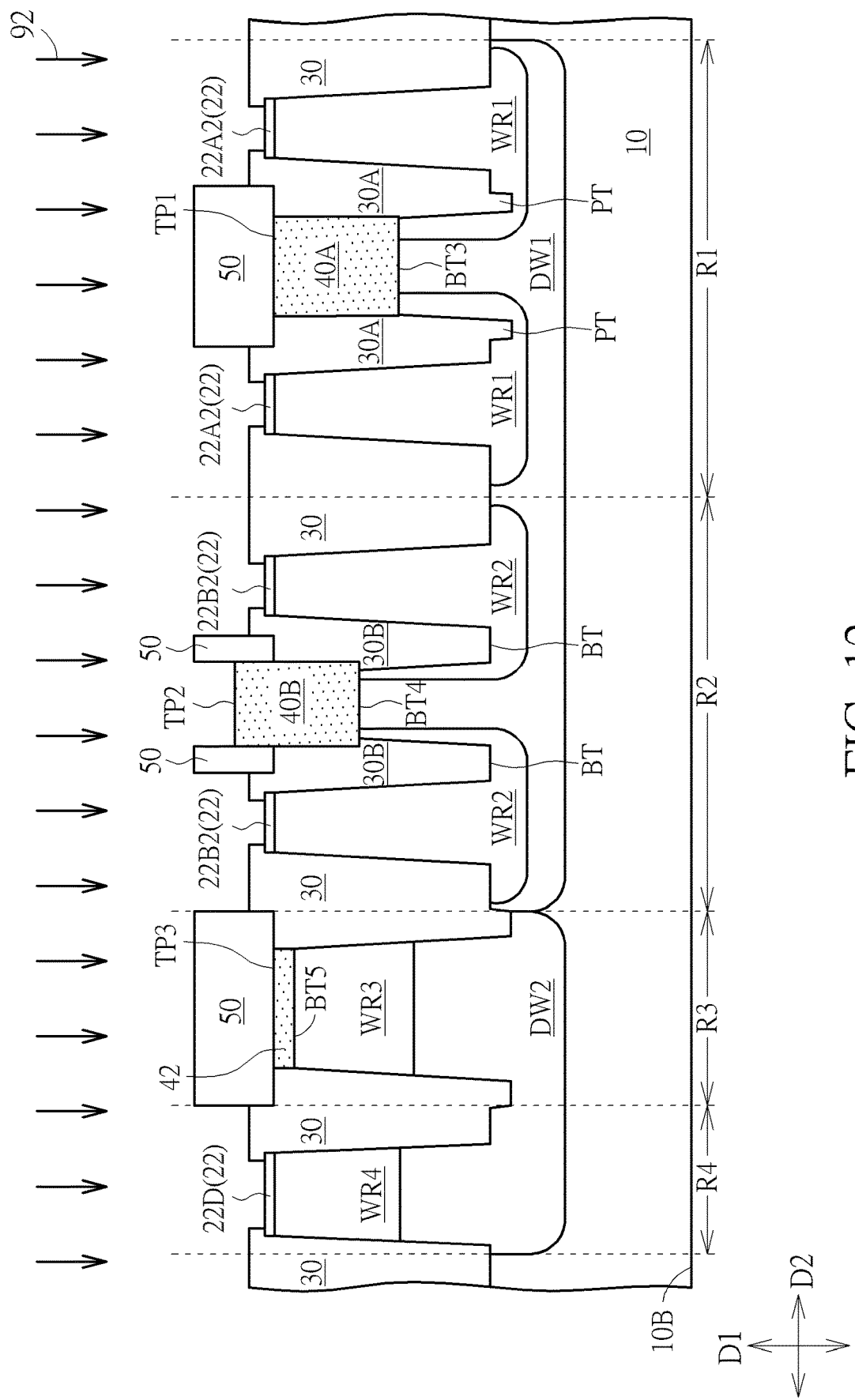
Figure 13:
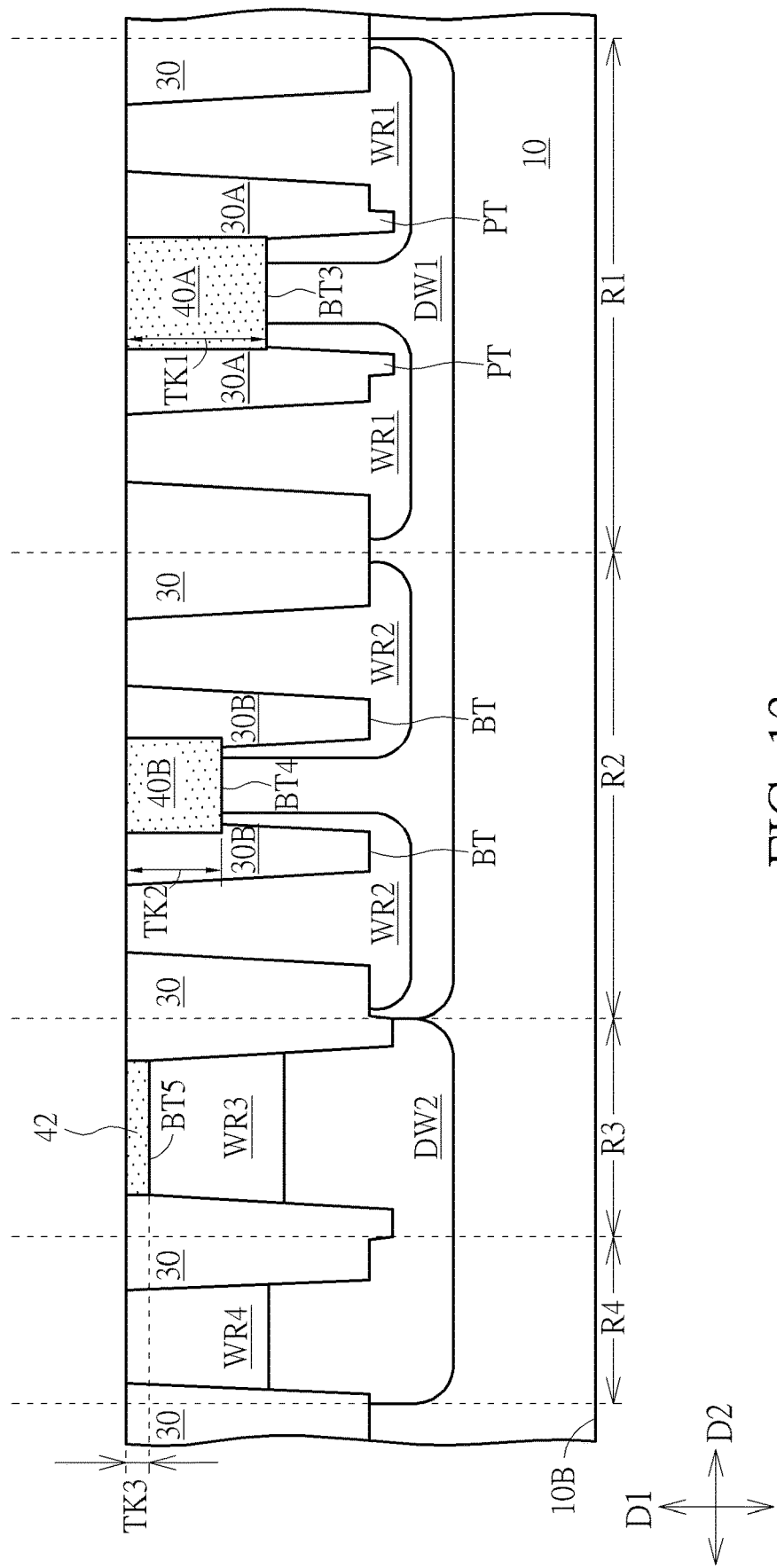

Please refer to FIGS. 1-14. FIGS. 1-14 are schematic drawings illustrating a manufacturing method of a semiconductor device according to a first embodiment of the present invention. The manufacturing method of the semiconductor device in this embodiment may include the following steps. As shown in FIG. 9, a first recess (such as a recess RC3 illustrated in FIG. 9) is formed in a first region R1 of a semiconductor substrate 10, and a second recess (such as a recess RC4 illustrated in FIG. 9) is formed in a second region R2 of the semiconductor substrate 10. A bottom surface BT1 of the recess RC3 is lower than a bottom surface BT2 of the recess RC4 in a vertical direction D1. In other words, the depth of the recess RC3 in the vertical direction D1 may be greater than the depth of the recess RC4 in the vertical direction D1. Subsequently, as shown in FIG. 10, a first gate oxide layer 40A and a second gate oxide layer 40B are formed concurrently. At least a portion of the first gate oxide layer 40A is formed in the recess RC3, and at least a portion of the second gate oxide layer 40B is formed in the recess RC4. As shown in FIG. 12 and FIG. 13, a removing process 92 is then performed for removing a part of the second gate oxide layer 40B. A thickness of the second gate oxide layer 40B (such as a thickness TK2 shown in FIG. 13) is less than a thickness of the first gate oxide layer 40A (such as a thickness TK1 shown in FIG. 13) after the removing process 92. In some embodiments, the first region R1 and the second region R2 may be transistor regions corresponding to different operation voltages, and the first gate oxide layer 40A and the second gate oxide layer 40B with different thicknesses may be used to improve electrical performance of corresponding transistor structures (such as high voltage transistor structures) under different operation voltages. For example, the transistor structure with the thicker first gate oxide layer 40A may be suitable for higher voltage operation, and the transistor structure with the thinner second gate oxide layer 40B may be suitable for lower voltage operation, but not limited thereto. By the manufacturing method of the present invention, the gate oxide layers may be concurrently formed on the recesses with different depths, and the thickness of the gate oxide layer located corresponding to the shallower recess may then be reduced by the removing process 92 for process simplification. For example, the process of forming the gate oxide layers may be simplified accordingly.

Figure 1:
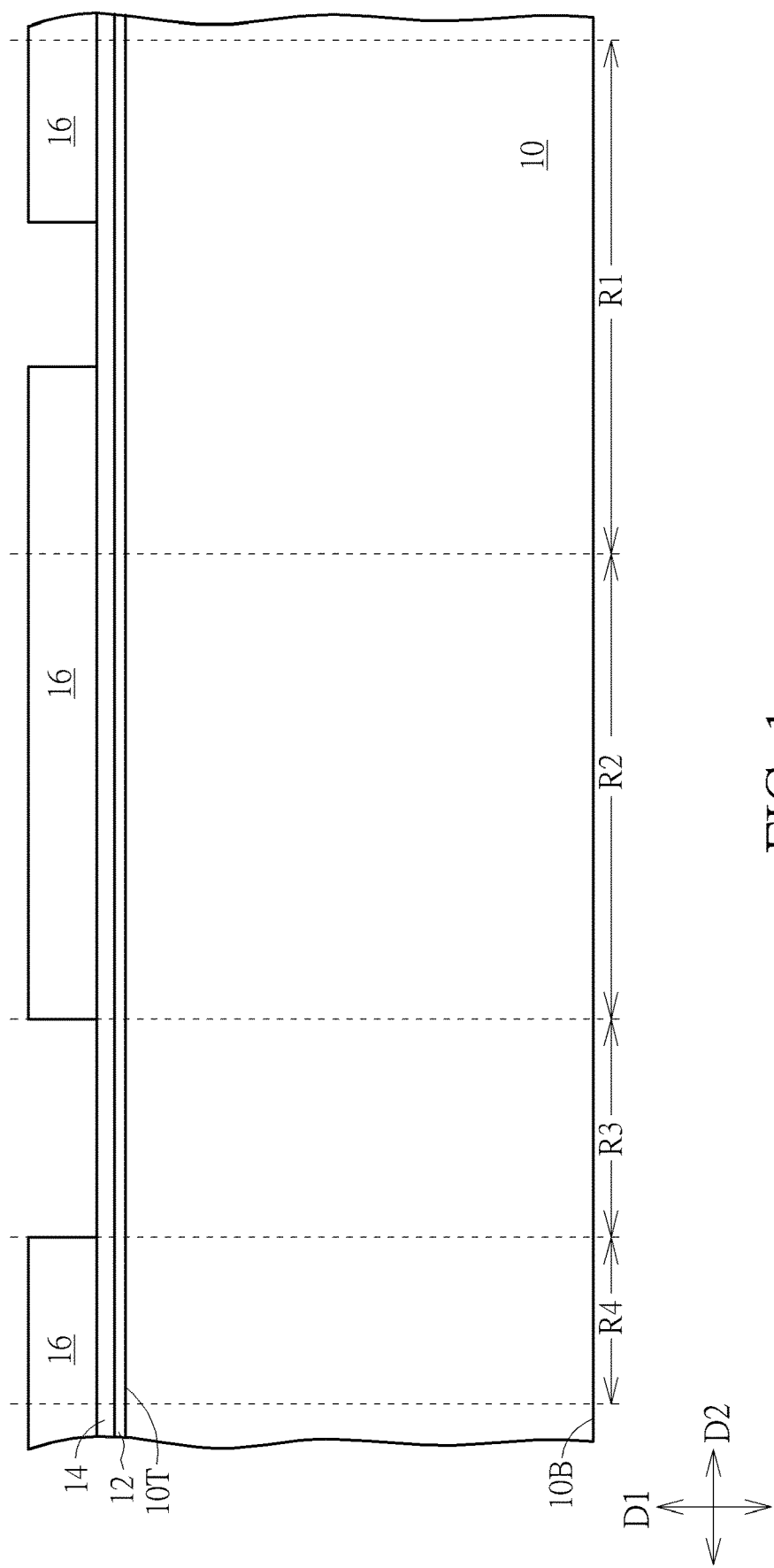

Specifically, the manufacturing method of the semiconductor device in this embodiment may include but is not limited to the following steps. As shown in FIG. 1, the semiconductor substrate 10 is provided, and a pad oxide layer 12, a hard mask layer 14, and a patterned mask layer 16 may be sequentially formed on the semiconductor substrate 10. In some embodiments, the semiconductor substrate 10 may include a silicon substrate, a silicon germanium substrate, a silicon-on-insulator (SOI) substrate, or a semiconductor substrate made of other suitable materials. The pad oxide layer 12 may include silicon oxide or other suitable oxide materials, the hard mask layer 12 may include silicon nitride or other suitable mask materials, and the patterned mask layer 16 may include a patterned photoresist layer or other suitable mask materials. The patterned mask layer 16 may be used as a mask in a patterning process performed to the hard mask layer 14 and/or the pad oxide layer 12, and the patterned mask layer 16 may be removed during the patterning process and/or after the patterning process. Additionally, the semiconductor substrate 10 may include a plurality of regions corresponding to different types of transistor structures. For example, the semiconductor substrate 10 may include a third region R3, a fourth region R4, the first region R1, and the second region R2 described above. Operation voltage of a transistor structure located corresponding to the first region R1 may be higher than operation voltage of a transistor structure located corresponding to the second region R2, the operation voltage of the transistor structure located corresponding to the second region R2 may be higher than operation voltage of a transistor structure located corresponding to the third region R3, and the operation voltage of the transistor structure located corresponding to the third region R3 may be higher than operation voltage of a transistor structure located corresponding to the fourth region R4, but not limited thereto.

In some embodiments, the vertical direction D1 described above may be regarded as a thickness direction of the semiconductor substrate 10, and the semiconductor substrate 10 may have a top surface 10T and a bottom surface 10B opposite to the top surface 10T in the vertical direction D1. The pad oxide layer 12, the hard mask layer 14, and the patterned mask layer 16 may be formed at a side of the top surface 10T. In addition, horizontal directions (such as a horizontal direction D2 shown in FIG. 1 and/or other directions orthogonal to the vertical direction D1) substantially orthogonal to the vertical direction D1 may be substantially parallel with the top surface 10T and/or the bottom surface 10B of the semiconductor substrate 10, but not limited thereto. In this description, a distance between the bottom surface 10B of the semiconductor substrate 10 and a relatively higher location and/or a relatively higher part in the vertical direction D1 is greater than a distance between the bottom surface 10B of the semiconductor substrate 10 and a relatively lower location and/or a relatively lower part in the vertical direction D1. The bottom or a lower portion of each component may be closer to the bottom surface 10B of the semiconductor substrate 10 in the vertical direction D1 than the top or upper portion of this component. Another component disposed above a specific component may be regarded as being relatively far from the bottom surface 10B of the semiconductor substrate 10 in the vertical direction D1, and another component disposed under a specific component may be regarded as being relatively closer to the bottom surface 10B of the semiconductor substrate 10 in the vertical direction D1. Additionally, in this description, the top surface of each component may include the topmost surface of the component in the vertical direction D1, and the bottom surface of each component may include the bottommost surface of the component in the vertical direction D1.

Figure 2:
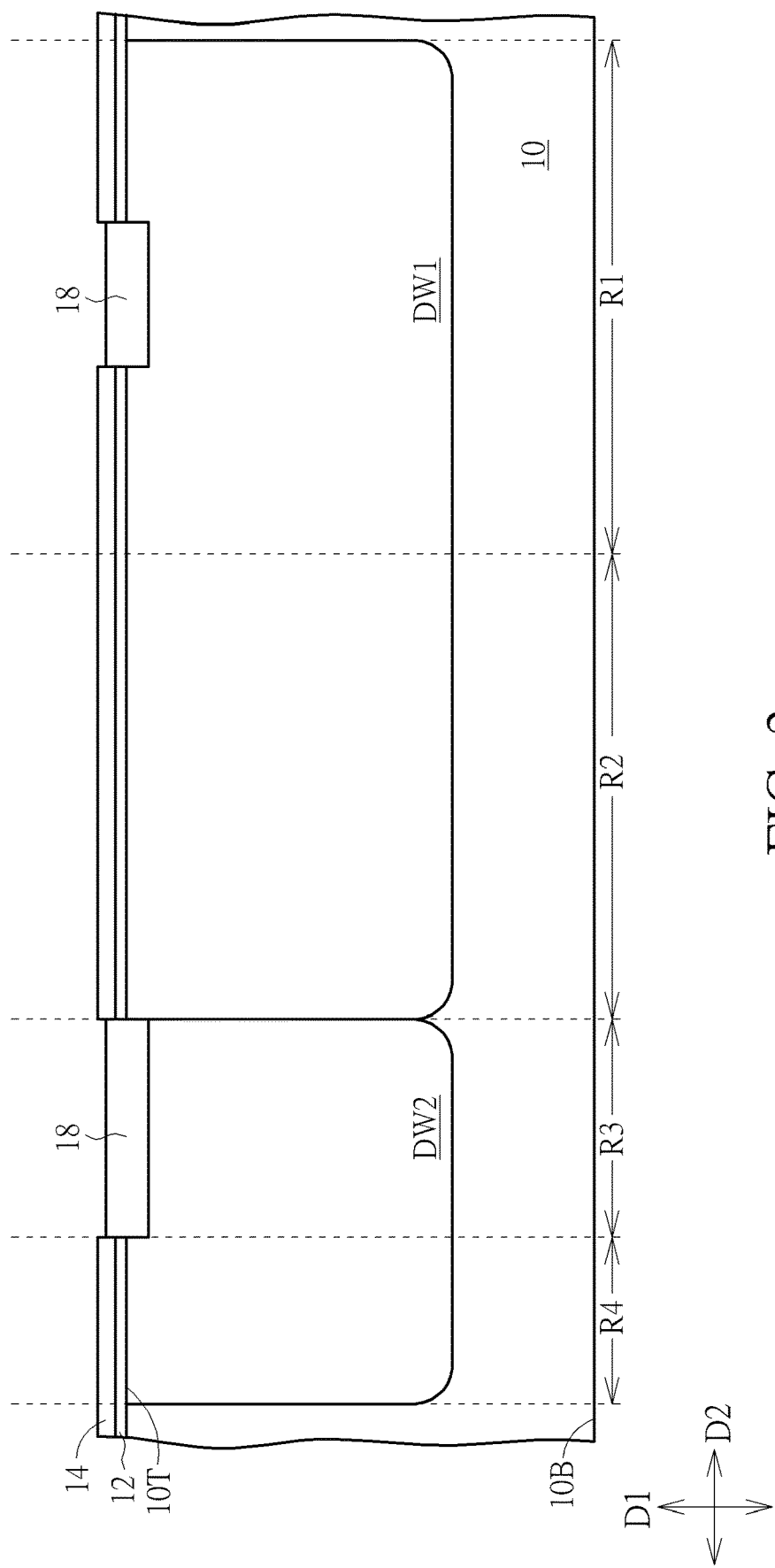
Figure 3:
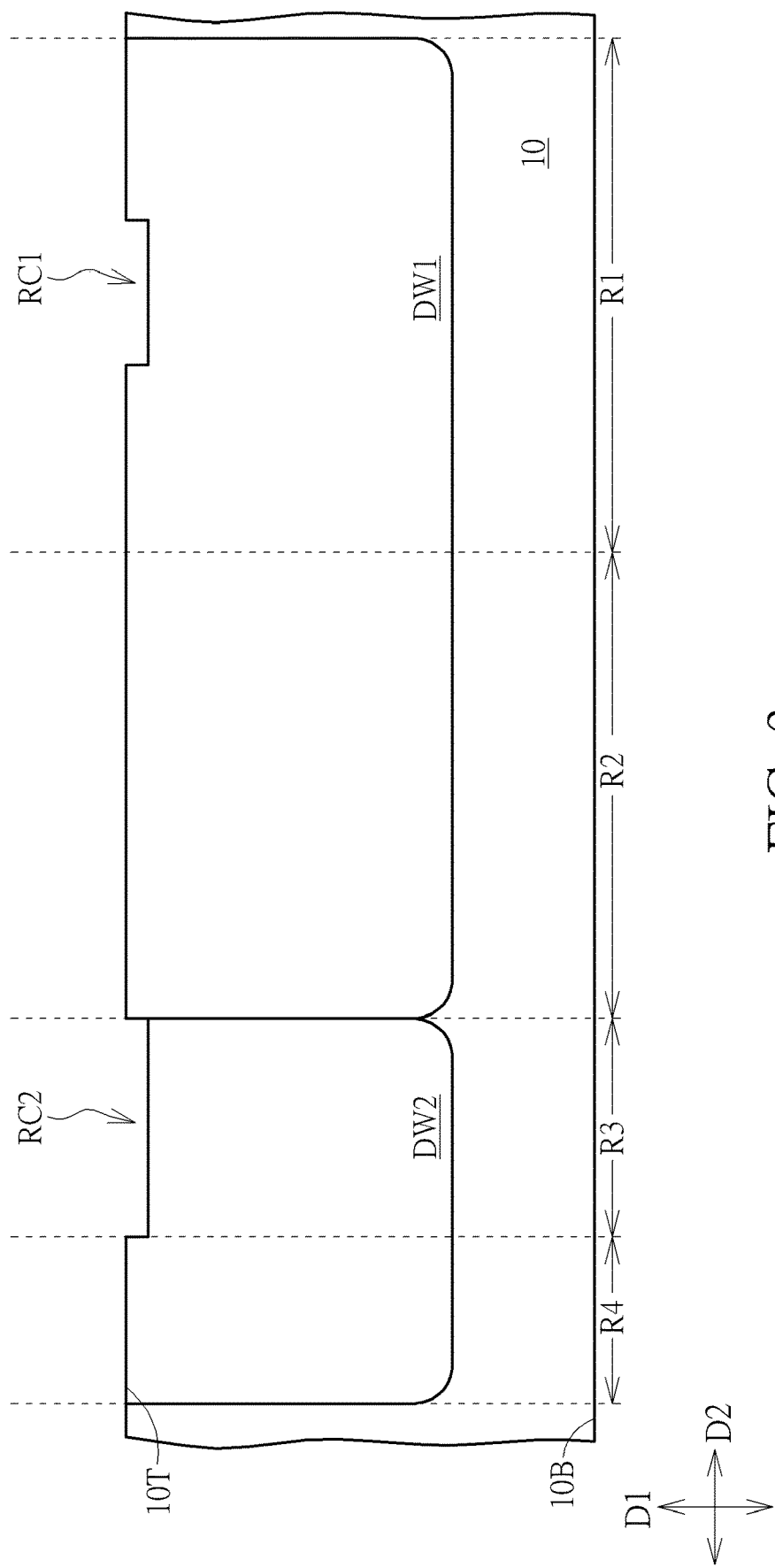

As shown in FIG. 1 and FIG. 2, the pad oxide layer 12 and the hard mask layer 14 may be formed on the first region R1, the second region R2, the third region R3, and the fourth region R4 of the semiconductor substrate 10. In some embodiments, a patterning process using the patterned mask layer 16 as a mask may be performed to the hard mask layer 14 and the pad oxide layer 12 for forming openings exposing a part of the semiconductor substrate 10, and an oxidation process may be performed to the exposed semiconductor substrate 10 for forming oxide layers 18. In some embodiments, the oxidation process for forming the oxide layers 18 may include a thermal oxidation process (such as rapid thermal oxidation, RTO) or other suitable oxidation approaches. As shown in FIG. 2 and FIG. 3, a part of the semiconductor substrate 10 will be oxidized to become the oxide layers 18, and the required recesses (such as a recess RC1 and a recess RC2 illustrated in FIG. 3) may be formed in the semiconductor substrate 10 after the step of removing the oxide layers 18 accordingly. In some embodiments, openings located corresponding to the first region R1 and the third region R3 of the semiconductor substrate 10 may be formed in the hard mask layer 14 and the pad oxide layer 12, and therefore the oxide layers 18 may be formed in the first region R1 and the third region R3, respectively. Accordingly, the recess RC1 and the recess RC2 may be formed in the first region R1 and the third region R3 of the semiconductor substrate 10, respectively, after removing the oxide layers 18, the pad oxide layer 12, and the hard mask layer 14.

By the manufacturing approach described above, the recess RC1 located in the first region R1 and the recess RC2 located in the third region R3 may be formed concurrently by the same process for process integration and/or process simplification. However, the method of forming the recess RC1 and the recess RC2 in the present invention is not limited to the steps described in FIGS. 1-3, and other suitable approaches may be applied to form the recess RC1 and the recess RC2 concurrently or respectively form the recess RC1 and the recess RC2 by different approaches according to some design considerations. In some embodiments, the recess RC1 and the recess RC2 may be a structure recessed from the top surface 10T of the semiconductor substrate 10 to the bottom surface 10B of the semiconductor substrate 10, and the depth of the recess RC1 may be substantially equal to the depth of the recess RC2 especially when the recess RC1 and the recess RC2 are formed concurrently by the same process, but not limited thereto. In some embodiments, required well regions may be formed in the semiconductor substrate 10 after the step of forming the oxide layers 18 and before the step of removing the oxide layers 18. For instance, a deep well region DW1 may be formed in the first region R1 and the second region R2 of the semiconductor substrate 10, and a deep well region DW2 may be formed in the third region R3 and the fourth region R4 of the semiconductor substrate 10, but not limited thereto. The deep well region DW1 and the deep well region DW2 may be doped regions formed in the semiconductor substrate 10 by doping processes (such as implantation processes), and the doping configurations of the deep well region DW1 and the deep well region DW2 may be adjusted according to the corresponding types of semiconductor structures or other design considerations. For example, the deep well region DW1 may be a p-type well region and the deep well region DW2 may be an n-type well region, but not limited thereto.

Figure 4:
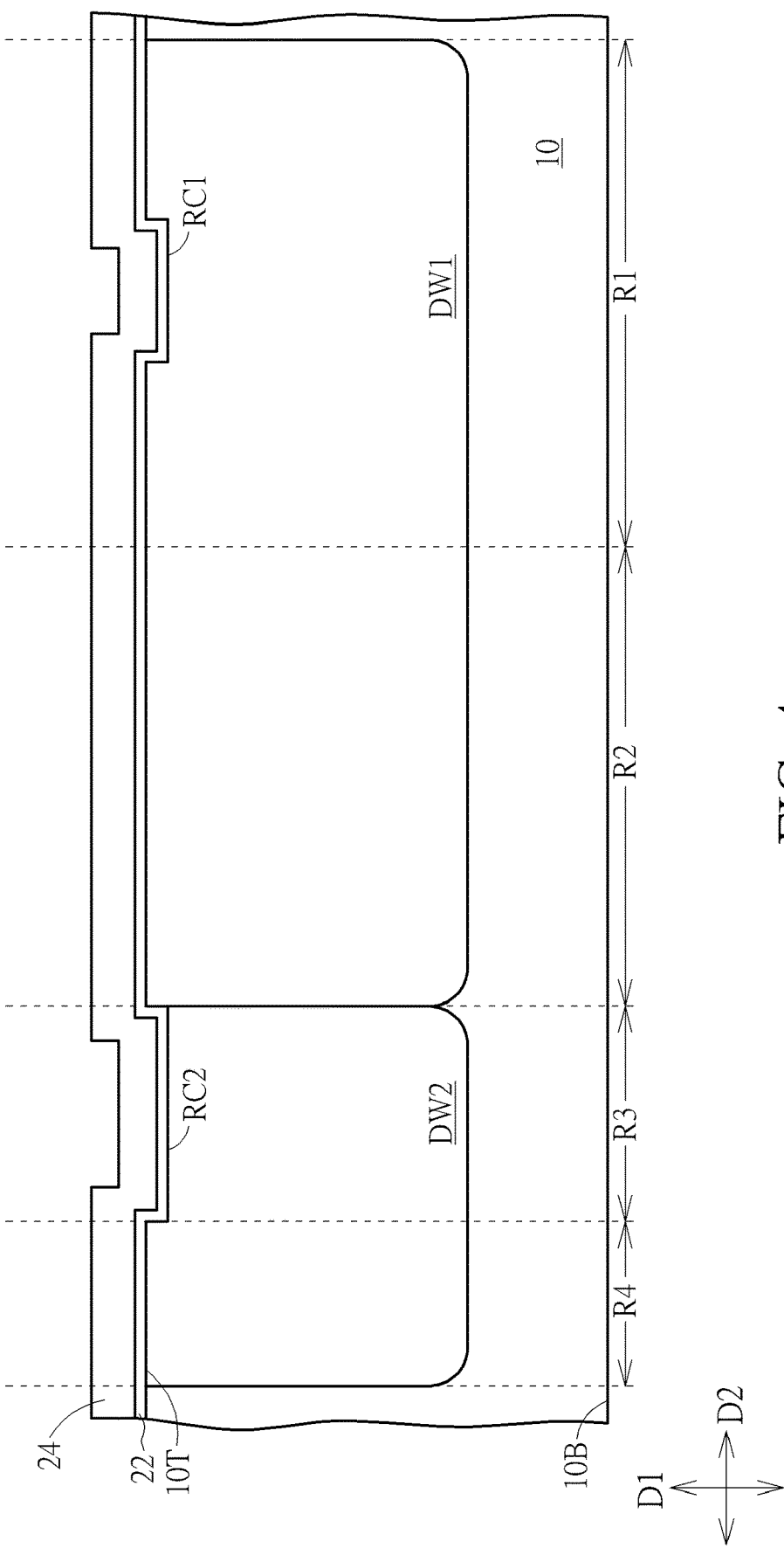

As shown in FIG. 3 and FIG. 4, after the step of forming the recess RC1 and the recess RC2, a pad oxide layer 22 and a hard mask layer 24 may be formed sequentially on the semiconductor substrate 10. The pad oxide layer 22 may include silicon oxide or other suitable oxide materials, and the hard mask layer 24 may include silicon nitride or other suitable mask materials. In some embodiments, the pad oxide layer 22 and the hard mask layer 24 may be globally formed on the semiconductor substrate 10. Therefore, the pad oxide layer 22 and the hard mask layer 24 may include portions formed on the first region R1, the second region R2, the third region R3, and the fourth region R4 of the semiconductor substrate 10, respectively. In some embodiments, the pad oxide layer 22 formed on the first region R1 may be partly formed in the recess RC1 and partly formed outside the recess RC1, and at least a part of the pad oxide layer 22 formed on the third region R3 may be formed in the recess RC2.

Figure 5:
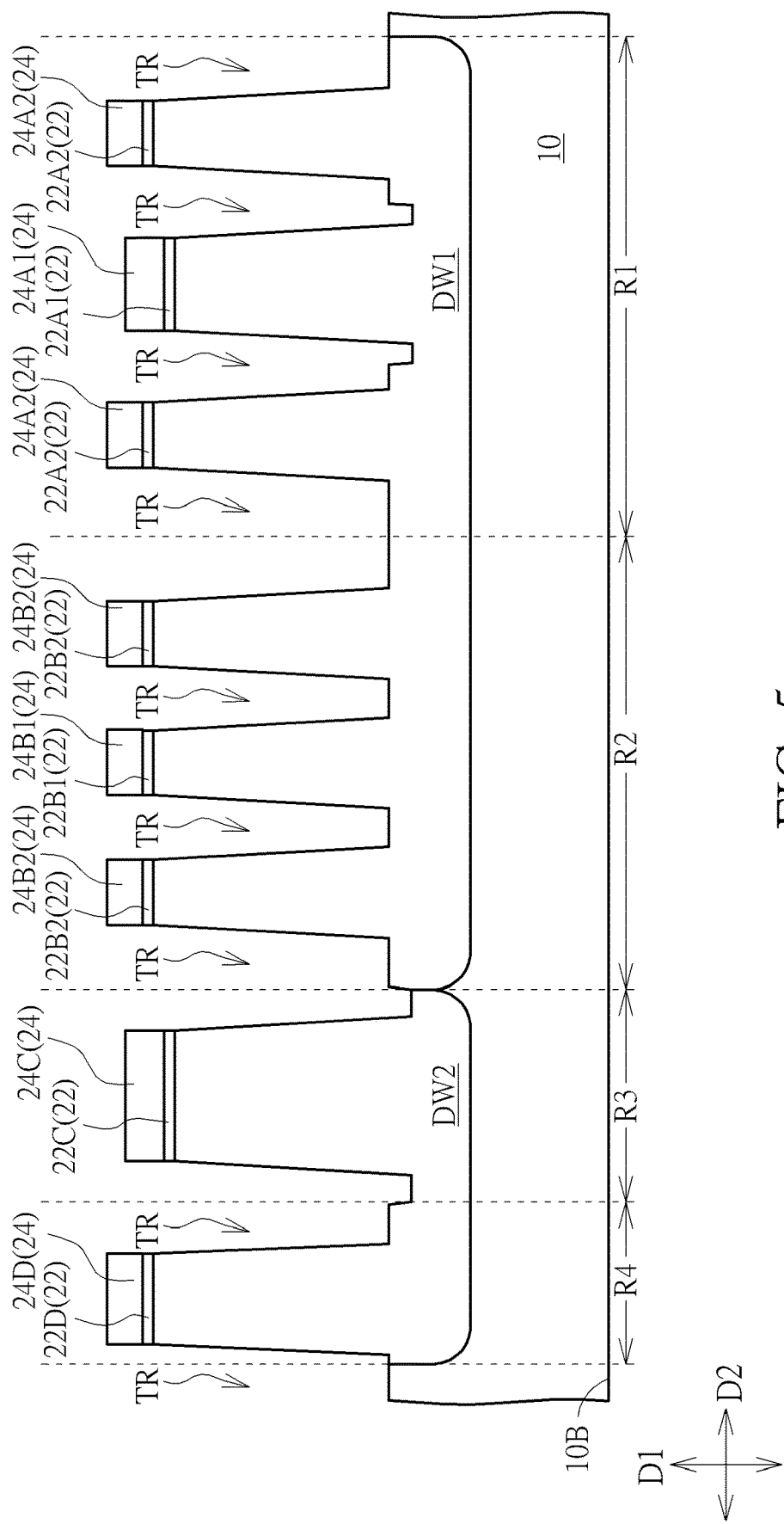

Subsequently, as shown in FIG. 4 and FIG. 5, a patterning process may be performed to the hard mask layer 24, the pad oxide layer 22, and the semiconductor substrate 10 for forming a plurality of trenches TR in the semiconductor substrate 10, and the trenches TR may be located corresponding to isolation structures formed in the subsequent processes. In some embodiments, the pad oxide layer 22 may be patterned by the patterning process to become a portion 22A1 and a portion 22A2 located on the first region R1, a portion 22B1 and a portion 22B2 located on the second region R2, a portion 22C located on the third region R3, and a portion 22D located on the fourth region R4. Comparatively, the hard mask layer 24 may be patterned by the patterning process to become a portion 24A1 and a portion 24A2 located on the first region R1, a portion 24B1 and a portion 24B2 located on the second region R2, a portion 24C located on the third region R3, and a portion 24D located on the fourth region R4.

As shown in FIG. 4 and FIG. 5, the portion 22A1 of the pad oxide layer 22 may be regarded as the pad oxide layer 22 formed in the recess RC1, and the portion 22C of the pad oxide layer 22 may be regarded as the pad oxide layer 22 formed in the recess RC2. Therefore, the portion 22A1 and the portion 22C may be lower than other portions of the pad oxide layer 22 (such as the portion 22B1 and the portion 22B2 located on the second region R2) in the vertical direction D1, and the corresponding portion 24A1 and portion 24C of the hard mask layer 24 may be lower than other portions of the hard mask layer 24 in the vertical direction D1, but not limited thereto. For example, the bottom surface of the portion 22A1 and the bottom surface of the portion 22C may be lower than the bottom surface of the portion 22B1 and the bottom surface of the portion 22B2 in the vertical direction D1, and the top surface of the portion 22A1 and the top surface of the portion 22C may be lower than the bottom surface and/or the top surface of the portion 22B1 and the bottom surface and/or the top surface of the portion 22B2 in the vertical direction D1. In addition, some of the trenches TR may be influenced by the recess RC1 and the recess RC2 and have relative lower bottoms and/or include additional protruding parts extending downwards, but not limited thereto.

Figure 6:
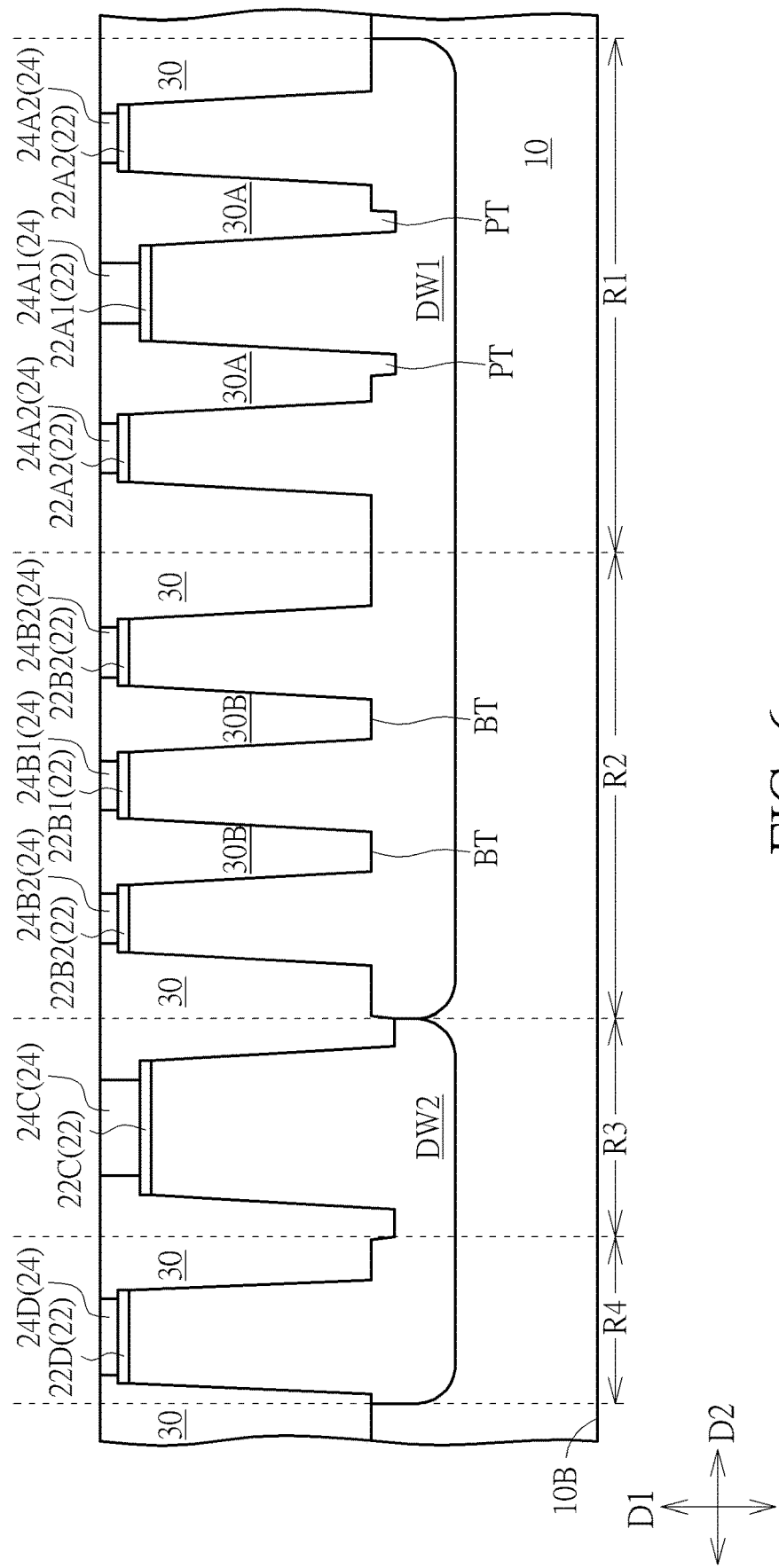

As shown in FIG. 5 and FIG. 6, the trenches TR may be filled with an insulation material, and a planarization process may be performed to the insulation material and the hard mask layer 24 for forming trench isolations 30, a first isolation structure 30A, and a second isolation structure 30B. The insulation material described above may be a single insulation layer or multiple insulation layers, such as oxide insulation layers or other suitable insulation materials. The first isolation structure 30A and the second isolation structure 30B may be formed in the first region R1 and the second region R2 of the semiconductor substrate 10, respectively. Because of the influence of the corresponding trenches TR, the first isolation structure 30A may include a protruding part PT extending downwards, and the protruding part PT may be lower than a bottom surface BT of the second isolation structure 30B in the vertical direction D1, but not limited thereto. Additionally, in some embodiments, before the step of forming the insulation material described above, an etching process may be performed to each portion of the hard mask layer 24 for reducing the size of each portion of the hard mask layer 24. Therefore, the trench isolations 30, the first isolation structure 30A, and the second isolation structure 30B formed subsequently may be partly located on the adjacent pad oxide layer 22 in the vertical direction D1, but not limited thereto.

Figure 7:
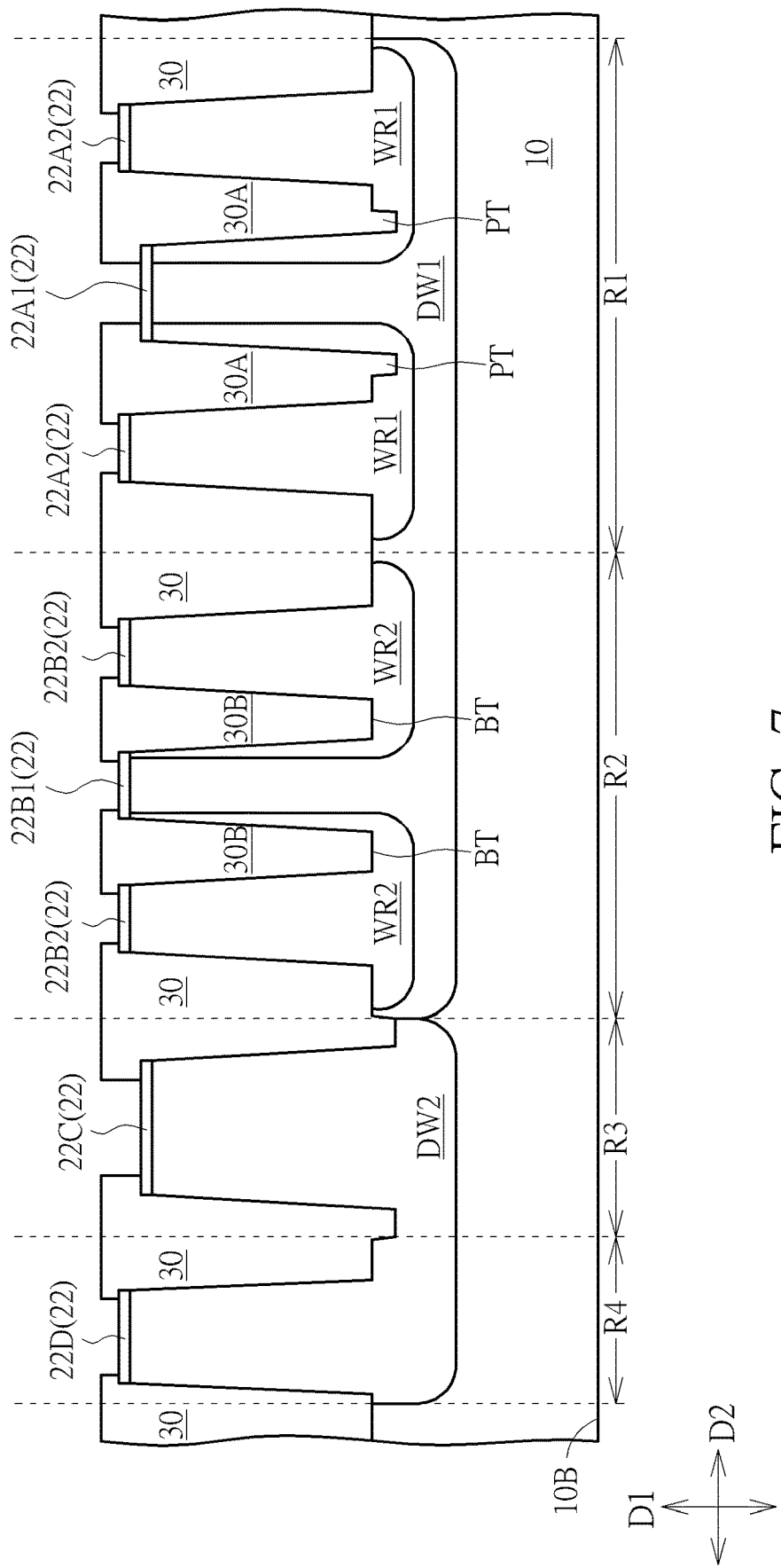

As shown in FIG. 6 and FIG. 7, the hard mask layer 24 may be removed for exposing each portion of the pad oxide layer 22, and a well region WR1 and a well region WR2 may be formed in the deep well region DW1 located in the first region R1 and the deep well region DW1 located in the second region R2, respectively. The well region WR1 and the well region WR2 may be doped regions formed in the semiconductor substrate 10 by doping processes (such as implantation processes), and the doping configurations of the well region WR1 and the well region WR2 may be adjusted according to the corresponding types of semiconductor structures or other design considerations. For example, when the deep well region DW1 is a p-type well region, the well region WR1 and the well region WR2 may be n-type doped regions, but not limited thereto. Additionally, in some embodiments, the well region WR1 and the well region WR2 may be regarded as drift regions in a high voltage transistor unit, but not limited thereto.

Figure 8:
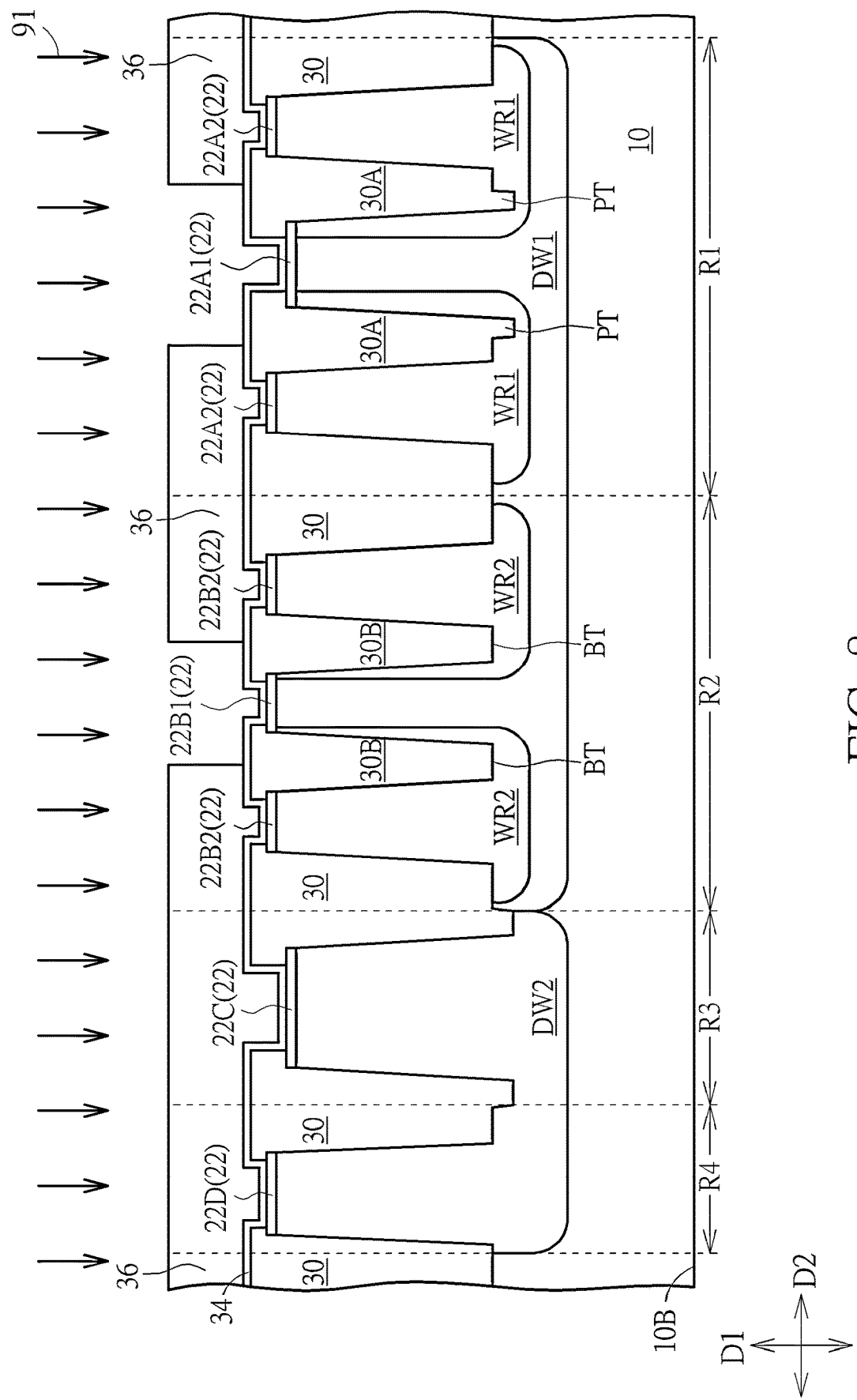
Figure 9:
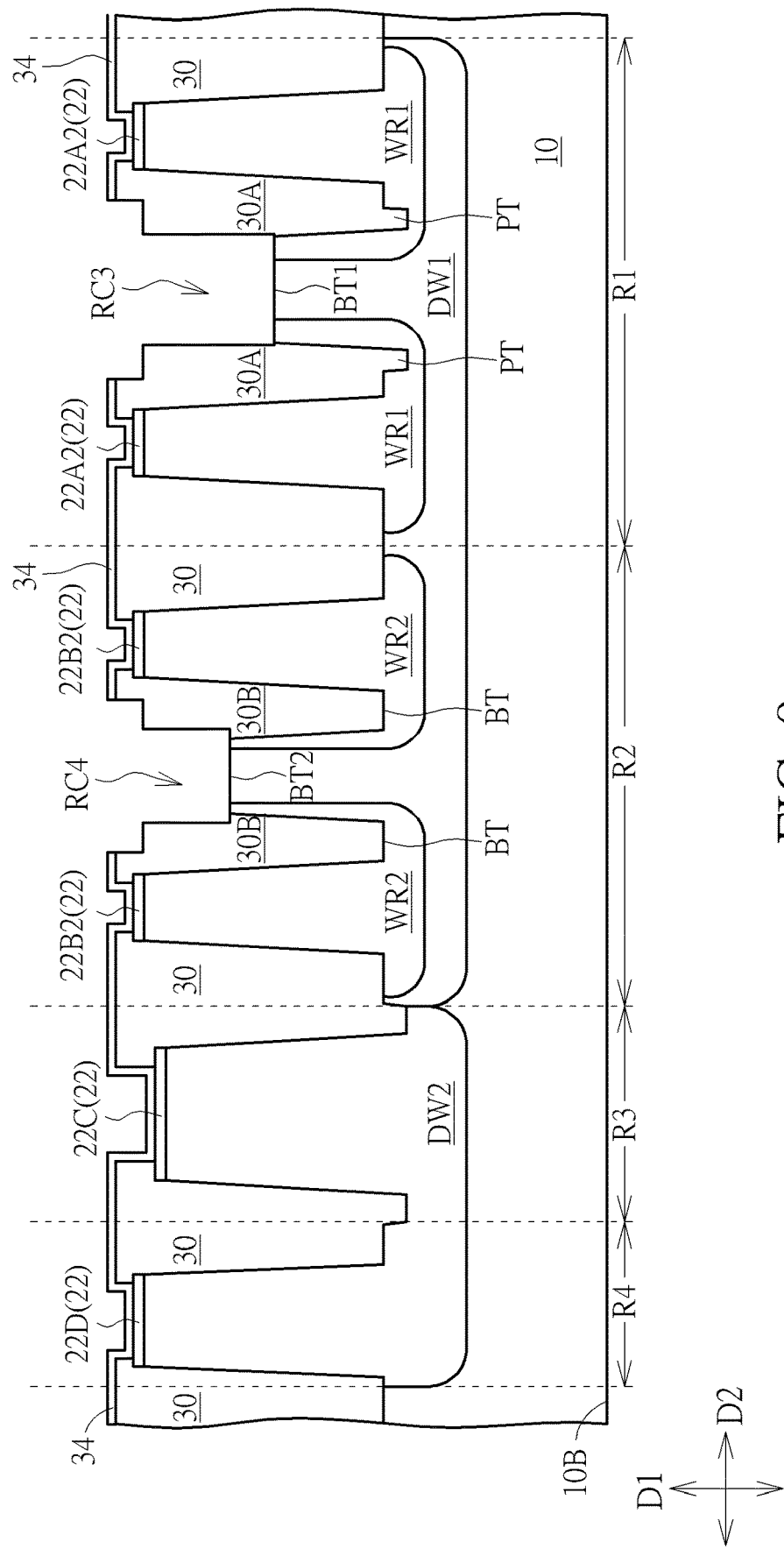
Figure 10:
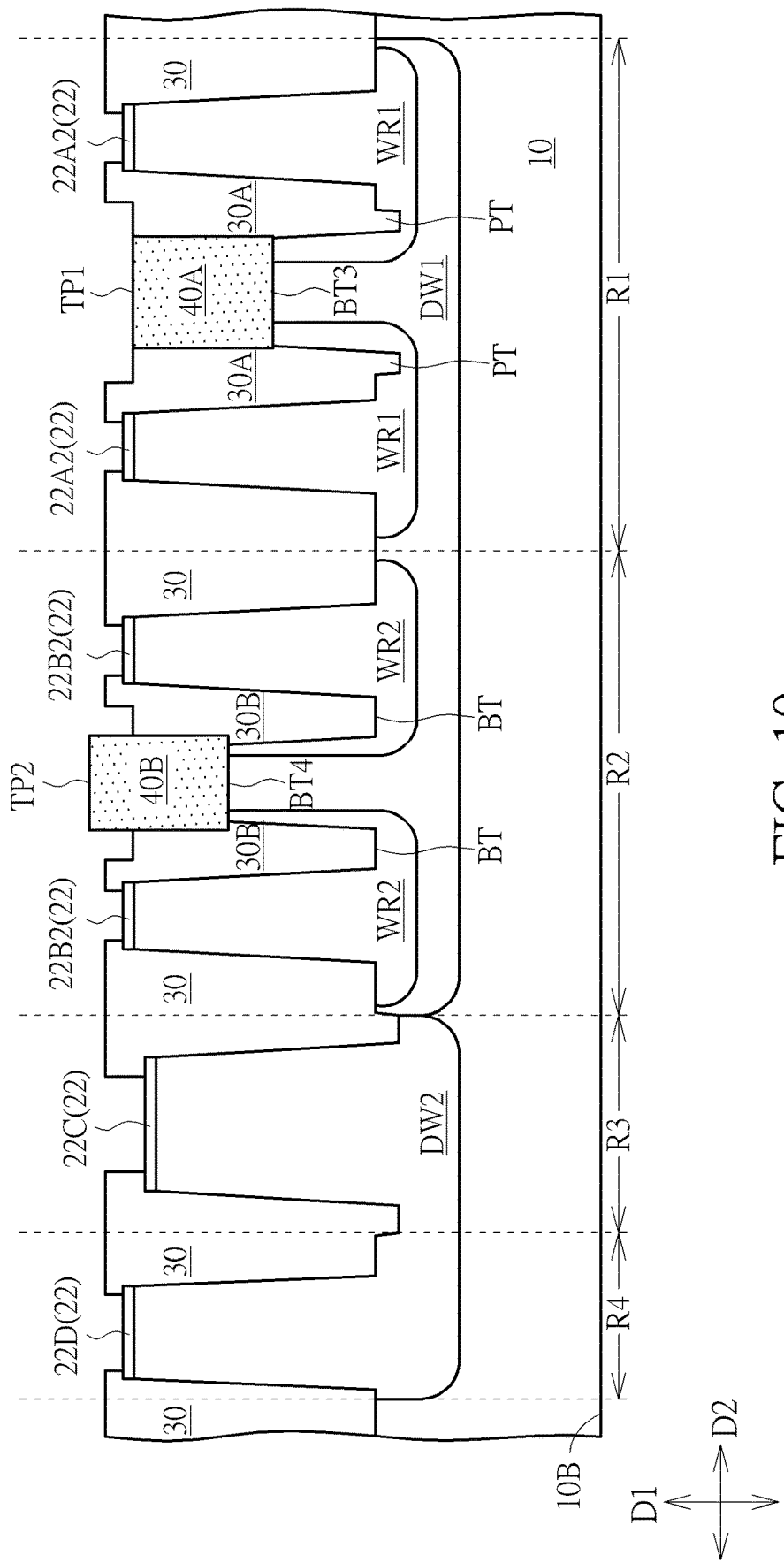

As shown in FIGS. 7-9, an etching process 91 may be performed for forming the recess RC3 and the recess RC4 in the semiconductor substrate 10. In some embodiments, a hard mask layer 34 and a patterned mask layer 36 may be sequentially formed on the semiconductor substrate 10 before the etching process 91. The hard mask layer 34 may include silicon nitride or other suitable mask materials, and the patterned mask layer 36 may include a patterned photoresist layer or other suitable mask materials. The patterned mask layer 36 may be used as a mask in the etching process 91, and the patterned mask layer 36 may be removed in the etching process 91 and/or removed after the etching process 91. The etching process 91 may include one or a plurality of etching steps for etching the hard mask layer 34, the pad oxide layer 22, the first isolation structure 30A, the second isolation structure 30B, and the semiconductor substrate 10 located corresponding to openings in the patterned mask layer 36, respectively, so as to form the recess RC3 and the recess RC4. In other words, the portion 22A1 and the portion 22B1 of the pad oxide layer 22, a portion of the hard mask layer 34, a portion of the first isolation structure 30A, and a portion of the second isolation structure 30B may be removed by the etching process 91 configured for forming the recess RC3 and the recess RC4.

It is worth noting that, in some embodiments, because of the influence of the recess RC1 illustrated in FIG. 3 described above, the portion 22A1 of the pad oxide layer 22 located on the first region R1 and the surface of the semiconductor substrate 10 located corresponding to the portion 22A1 are lower than the portion 22B1 of the pad oxide layer 22 located on the second region R2 and the surface of the semiconductor substrate 10 located corresponding to the portion 22B1 in the vertical direction D1, and the bottom surface BT1 of the recess RC3 will be lower than the bottom surface BT2 of the recess RC4 in the vertical direction D1 when the recess RC3 and the recess RC4 are formed by removing the portion 22A1 and the portion 22B1 of the pad oxide layer 22 and the corresponding portions of the semiconductor substrate 10 with the etching process 91. In other words, the recess (such as the recess RC1 illustrated in FIG. 3) may be formed in the first region R1 by the step of forming the recess in the third region R3, and the recess RC3 and the recess RC4 concurrently formed by the etching process 91 may have different depths in the vertical direction D1 because of the influence of the recess RC1. The depths of the recesses may be modified without additional processes, and the purposes of process integration and/or process simplification may be achieved accordingly. However, the method of forming the recess RC3 and the recess RC4 in the present invention is not limited to the steps described above, the recess RC3 and the recess RC4 may be formed concurrently by other suitable approaches, or the recess RC3 and the recess RC4 may be formed by different approaches, respectively, according to some design considerations.

As shown in FIG. 9 and FIG. 10, the first gate oxide layer 40A and the second gate oxide layer 40B may be formed concurrently by the same process, and the hard mask layer 34 may be removed. In some embodiments, the first gate oxide layer 40A and the second gate oxide layer 40B may be formed concurrently by an oxidation process, and the oxidation process may include a thermal oxidation process (such as RTO) or other suitable oxidation approaches. In some embodiments, the thermal oxidation process described above may include an in-situ-steam-generation (ISSG) process or other suitable thermal oxidation approaches. In addition, the first gate oxide layer 40A and the second gate oxide layer 40B may be oxide layers formed by oxidizing the semiconductor substrate 10 exposed by the recess RC3 and the recess RC4, respectively. By the influence of the difference between the depth of the recess RC3 and the depth of the recess RC4, a top surface TP2 of the second gate oxide layer 40B may be higher than a top surface TP1 of the first gate oxide layer 40A in the vertical direction D1, and a bottom surface BT3 of the first gate oxide layer 40A may be lower than a bottom surface BT4 of the second gate oxide layer 40B in the vertical direction D1. Additionally, in some embodiments, a portion of the second gate oxide layer 40B (such as an upper portion) may be formed outside the recess RC4, the first isolation structure 30A may surround the first gate oxide layer 40A in the horizontal direction D2 and may be directly connected with the first gate oxide layer 40A, and the second isolation structure 30B may surround the second gate oxide layer 40B in the horizontal direction D2 and may be directly connected with the second gate oxide layer 40B.

Figure 11:
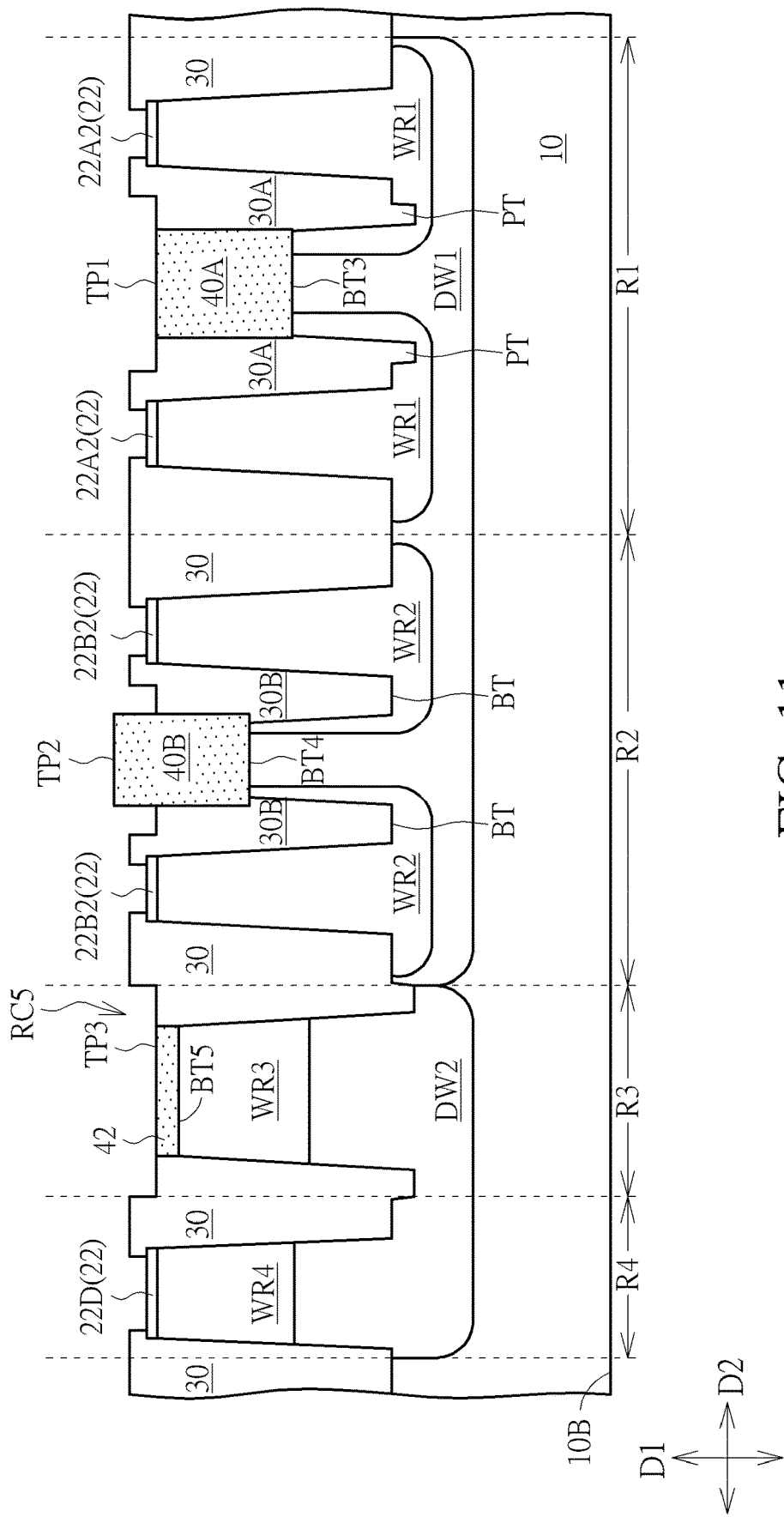

Subsequently, as shown in FIG. 10 and FIG. 11, after the step of forming the first gate oxide layer 40A and the second gate oxide layer 40B, the portion 22C of the pad oxide layer 22 located on the third region R3 may be removed, and a third gate oxide layer 42 may be formed on the third region R3 after the step of removing the portion 22C of the pad oxide layer 22. In some embodiments, the third gate oxide layer 42 may be formed by an oxidation process and/or a deposition process (such as an atomic layer deposition, ALD), but not limited thereto. Additionally, in some embodiments, a well region WR3 and a well region WR4 may be formed in the deep well region DW2 located in the third region R3 and the deep well region DW2 located in the fourth region R4, respectively, before the step of forming the third gate oxide layer 42. The well region WR3 and the well region WR4 may be doped regions formed in the semiconductor substrate 10 by doping processes (such as implantation processes), and the doping configurations of the well region WR3 and the well region WR4 may be adjusted according to the corresponding types of semiconductor structures or other design considerations. Additionally, in some embodiments, a bottom surface BT5 of the third gate oxide layer 42 may be higher than the bottom surface BT3 of the first gate oxide layer 40A and the bottom surface BT4 of the second gate oxide layer 40B in the vertical direction D1, a top surface TP3 of the third gate oxide layer 42 may be lower than the top surface TP2 of the second gate oxide layer 40B in the vertical direction D1, and the thickness of the third gate oxide layer 42 in the vertical direction D1 may be less than the thickness of the first gate oxide layer 40A and the thickness of the second gate oxide layer 40B. In some embodiments, a part of the trench isolations 30 in the third region R3 may be removed for forming a recess RC5 after the step of forming the first gate oxide layer 40A and the second gate oxide layer 40B and before the step of forming the third gate oxide layer 42, but not limited thereto.

As shown in FIGS. 11-13, the removing process 92 may be performed for removing a part of the second gate oxide layer 40B and adjusting the thickness of the second gate oxide layer 40B. In some embodiments, before the removing process 92, a patterned mask layer 50 may be formed on the semiconductor substrate 10, and the patterned mask layer 50 may include a patterned photoresist layer or other suitable mask materials. The patterned mask layer 50 may cover the first gate oxide layer 40A, the third gate oxide layer 42, a part of the first isolation structure 30A, a part of the second isolation structure 30B, and the trench isolations 30 located in the third region R3 during the removing process 92. The patterned mask layer 50 may be removed after the removing process 92, and at least a part of the materials without being covered by the patterned mask layer 50 during the removing process 92 may be removed by the removing process 92. For example, the portion 22A2, the portion 22B2, and the portion 22D of the pad oxide layer 22 may be removed by the removing process 92; a portion of the first isolation structure 30A, a portion of the second isolation structure 30B, and a portion of the trench isolations 30 located in the first region R1, the second region R2, and the fourth region R4 may be removed by the removing process 92; and the upper portion of the second gate oxide layer 40B (such as the second gate oxide layer 40B located outside the recess described above) may be removed by the removing process 92, but not limited thereto.

In some embodiments, the removing process 92 may include a dry etching step and a wet etching step performed after the dry etching step for etching the materials described above and improving the surface flatness by these etching steps, but not limited thereto. In some embodiments, an etchant using in the wet etching step described above may include diluted hydrofluoric acid (DHF) or other suitable wet etchants. It is worth noting that the removing process 92 may be originally regarded as a process configured to remove the pad oxide layer 22 located on the fourth region R4, the thickness of the second gate oxide layer 40B may be adjusted concurrently by the removing process 92 through the manufacturing method described above, and the purposes of process integration and/or process simplification may be achieved accordingly. In addition, the thickness of the second gate oxide layer 40B may be reduced by the removing process 92, but the thickness of the third gate oxide layer 42 (such as a thickness TK3 shown in FIG. 13) may be still less than the thickness TK2 of the second gate oxide layer 40B and the thickness TK1 of the first gate oxide layer 40A after the removing process 92 for satisfying the design of the corresponding transistor structures.

Figure 14:
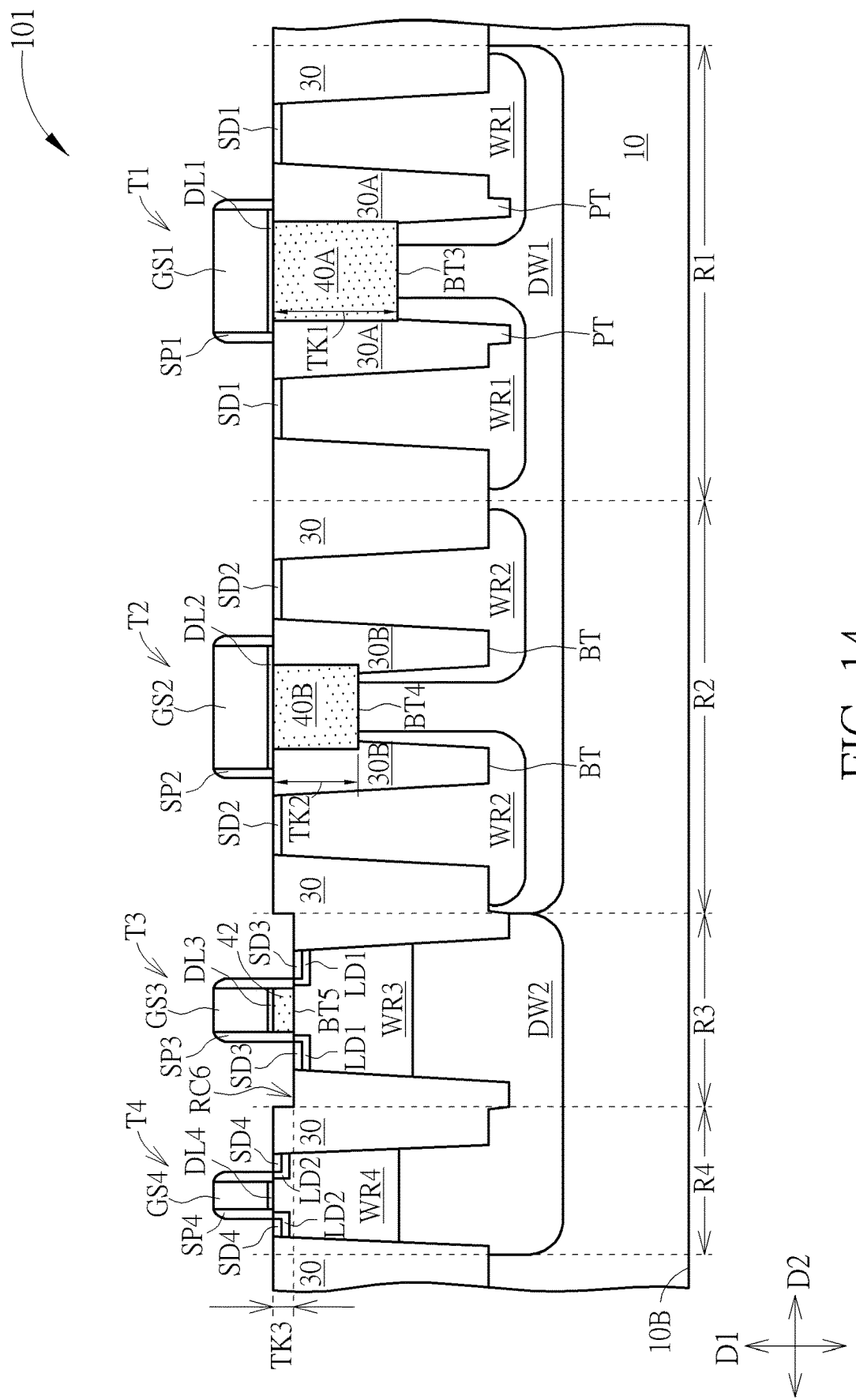

Subsequently, as shown in FIG. 14, corresponding dielectric layers (such as a dielectric layer DL1, a dielectric layer DL2, a dielectric layer DL3, and a dielectric layer DL4), corresponding gate structures (such as a gate structure GS1, a gate structure GS2, a gate structure GS3, and a gate structure GS4), and corresponding spacer structures (such as a spacer structure SP1, a spacer structure SP2, a spacer structure SP3, and a spacer structure SP4) may be formed on the first region R1, the second region R2, the third region R3, and the fourth region R4, respectively, and corresponding doped regions (such as source/drain regions SD1, source/drain regions SD2, source/drain regions SD3, source/drain regions SD4, lightly doped regions LD1, and lightly doped regions LD2) may be formed in the first region R1, the second region R2, the third region R3, and the fourth region R4, respectively, so as to form a semiconductor device 101 including a transistor structure T1, a transistor structure T2, a transistor structure T3, and a transistor structure T4. In some embodiments, the transistor structure T1 located on the first region R1 and the transistor structure T2 located on the second region R2 may be regarded as high voltage transistor structures, and the operation voltage suitable for the transistor structure T1 including the thicker first gate oxide layer 40A may be higher than the operation voltage suitable for the transistor structure T2 including the thinner second gate oxide layer 40B. Additionally, the operation voltage of the transistor structure T2 may be higher than that of the transistor structure T3 located on the third region R3, and the operation voltage of the transistor structure T3 may be higher than that of the transistor structure T4 located on the fourth region R4, but not limited thereto.

In some embodiments, before the step of forming the spacer structures, a part of the third gate oxide layer 42 and a part of the trench isolations 30 located in the third region R3 may be removed for forming a recess RC6 exposing the well region WR3 in the third region R3, and the lightly doped region LD1 and the source/drain regions SD3 may then be formed in the well region WR3 accordingly, but not limited thereto. Additionally, each of the dielectric layers described above may include an oxide dielectric material or other suitable dielectric materials, and each of the gate structures described above may include a gate dielectric layer and a gate electrode. The gate dielectric layer may include a high dielectric constant (high-k) dielectric material or other suitable dielectric materials, and the gate electrode may include a non-metallic electrically conductive material (such as doped polysilicon) or a metallic electrically conductive material, such as a metal gate structure formed with an electrically conductive work function layer and a low electrical resistivity layer stacked with each other, but not limited thereto. Additionally, the gate structures in the transistor structures may have different material compositions according to some design considerations, such as different work function layer stacked structures, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 15:
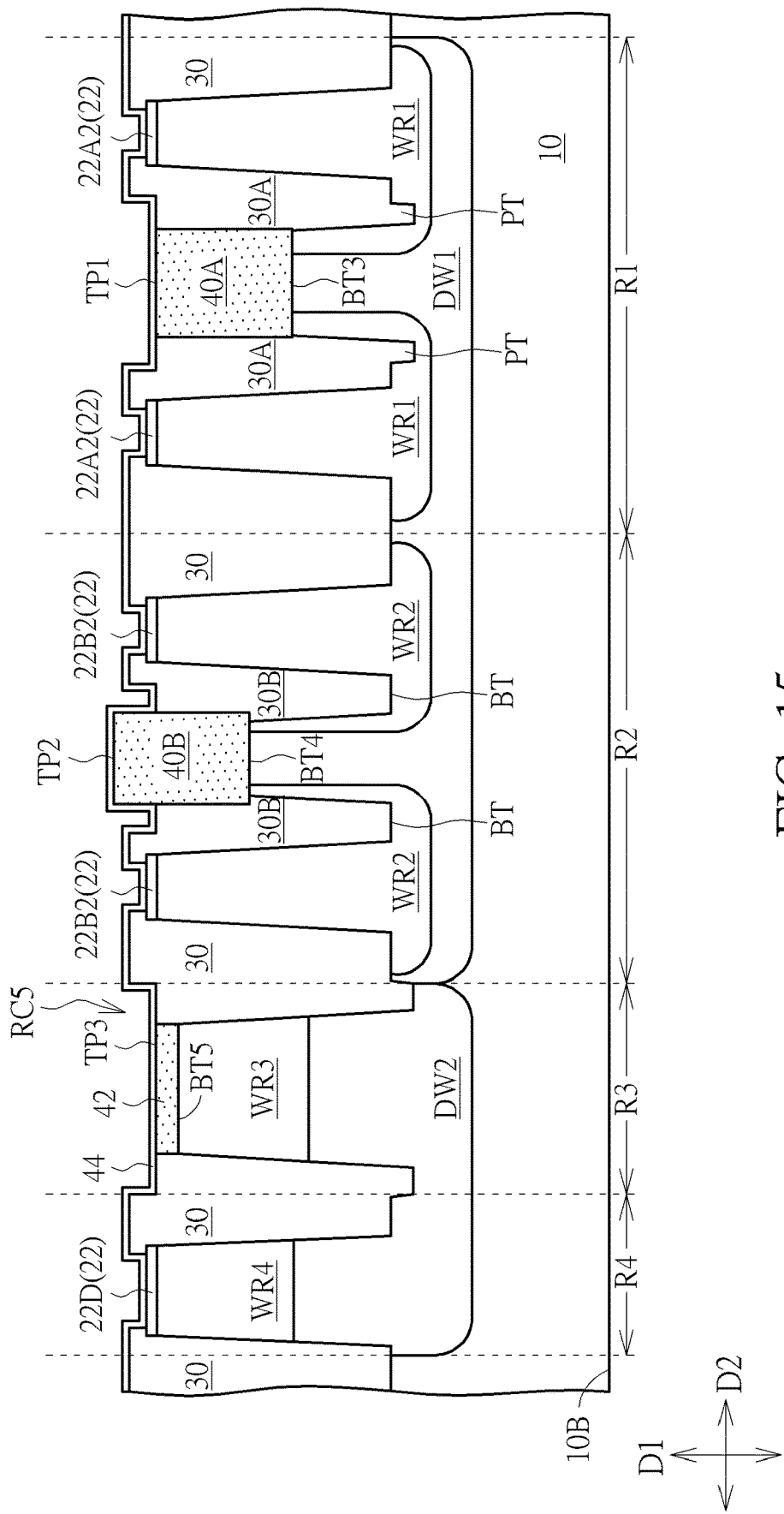
Figure 16:
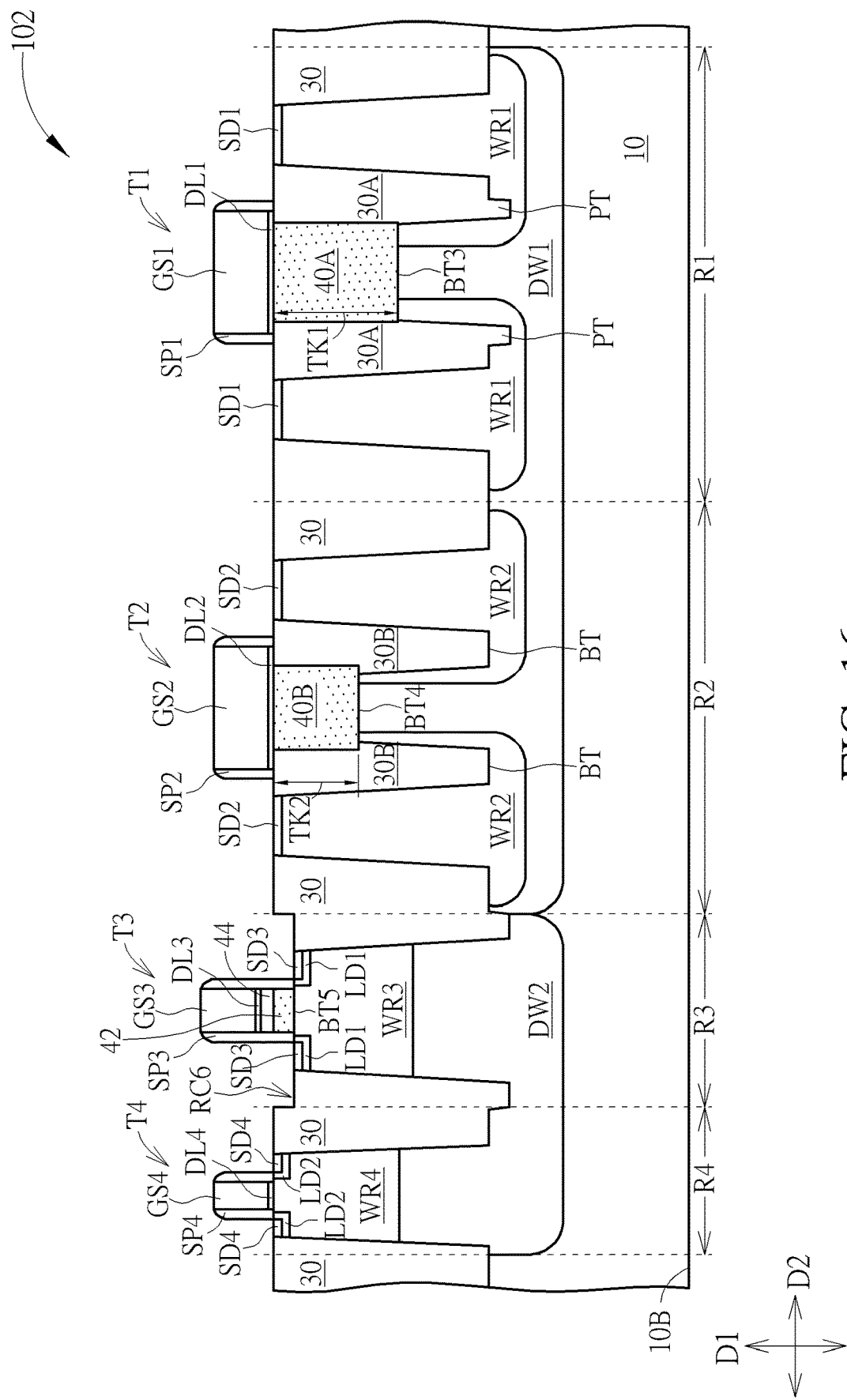

Please refer to FIG. 15, FIG. 16, and FIG. 11. FIGS. 15 and 16 are schematic drawings illustrating a manufacturing method of a semiconductor device 102 according to a second embodiment of the present invention, wherein FIG. 16 is a schematic drawing in a step subsequent to FIG. 15, and FIG. 15 may be regarded as a schematic drawing in a step subsequent to FIG. 11. As shown in FIG. 11 and FIG. 15, in some embodiments, the gate oxide layer 44 may be globally formed after the step of forming the third gate oxide layer 42, and the gate oxide layer 44 formed on the third gate oxide layer 42 may remain after the removing process described above and become a portion of the transistor structure on the third region R3. In some embodiments, the third gate oxide layer 42 and the gate oxide layer 44 may be formed by different processes, respectively. For example, the third gate oxide layer 42 may be formed by an oxidation process and the gate oxide layer 44 may be formed by an atomic layer deposition process for controlling the thickness of the gate oxide layer of the transistor structure on the third region R3 more precisely, but not limited thereto. As shown in FIG. 15 and FIG. 16, the gate oxide layer 44 on the third region R3 may be located between the third gate oxide layer 42 and the dielectric layer DL3 in the vertical direction D1, and the gate oxide layer 44 located on other regions may be removed by the removing process described above and/or other additional processes, but not limited thereto.

To summarize the above descriptions, according to the manufacturing method of the semiconductor device in the present invention, the gate oxide layers may be formed concurrently on the recesses with different depths, and the thickness of the gate oxide layer formed corresponding to the shallower recess may then be reduced by the removing process for satisfying the requirements for different operation voltages of the transistor structures. Additionally, the purpose of process simplification may be achieved by integrating the manufacturing process with the process of other regions in the semiconductor substrate, and that is beneficial for the related manufacturing cost and/or the related manufacturing yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
    forming a first recess in a first region of a semiconductor substrate;
    forming a second recess in a second region of the semiconductor substrate, wherein a bottom surface of the first recess is lower than a bottom surface of the second recess in a vertical direction, and the first recess and the second recess are formed concurrently;
    forming a first gate oxide layer and a second gate oxide layer concurrently, wherein at least a portion of the first gate oxide layer is formed in the first recess, and at least a portion of the second gate oxide layer is formed in the second recess;
    performing a removing process for removing a part of the second gate oxide layer, wherein a thickness of the second gate oxide layer is less than a thickness of the first gate oxide layer after the removing process;
    forming a pad oxide layer on the semiconductor substrate before the first recess and the second recess are formed, wherein a first portion of the pad oxide layer is formed on the first region of the semiconductor substrate, a second portion of the pad oxide layer is formed on the second region of the semiconductor substrate, and a third portion of the pad oxide layer is formed on a third region of the semiconductor substrate; and
    removing the third portion of the pad oxide layer after the first gate oxide layer and the second gate oxide layer are formed and before the removing process.

2. The manufacturing method of the semiconductor device according to claim 1, wherein a bottom surface of the first gate oxide layer is lower than a bottom surface of the second gate oxide layer in the vertical direction.

3. The manufacturing method of the semiconductor device according to claim 1, wherein a top surface of the second gate oxide layer is higher than a top surface of the first gate oxide layer in the vertical direction before the removing process.

4. The manufacturing method of the semiconductor device according to claim 1, wherein the first portion and the second portion of the pad oxide layer are removed by the removing process.

5. The manufacturing method of the semiconductor device according to claim 1, further comprising:
    forming a third gate oxide layer on the third region of the semiconductor substrate after the third portion of the pad oxide layer is removed and before the removing process.

6. The manufacturing method of the semiconductor device according to claim 5, wherein a thickness of the third gate oxide layer is less than the thickness of the second gate oxide layer before and after the removing process.

7. The manufacturing method of the semiconductor device according to claim 5, wherein a bottom surface of the third gate oxide layer is higher than a bottom surface of the first gate oxide layer and a bottom surface of the second gate oxide layer in the vertical direction.

8. The manufacturing method of the semiconductor device according to claim 5, further comprising:
    forming a patterned mask layer on the semiconductor substrate before the removing process, wherein the first gate oxide layer and the third gate oxide layer are covered by the patterned mask layer during the removing process.

9. The manufacturing method of the semiconductor device according to claim 1, further comprising:
    forming a third recess in first region of the semiconductor substrate; and
    forming a fourth recess in the third region of the semiconductor substrate, wherein the third recess and the fourth recess are formed concurrently before the pad oxide layer is formed, the third portion of the pad oxide layer is formed in the fourth recess, and the first portion of the pad oxide layer is partly formed in the third recess and partly formed outside the third recess.

10. The manufacturing method of the semiconductor device according to claim 9, wherein the first portion of the pad oxide layer located in the third recess is lower than the second portion of the pad oxide layer in the vertical direction.

11. The manufacturing method of the semiconductor device according to claim 9, wherein the first portion of the pad oxide layer located in the third recess is removed by a process of forming the first recess, and the second portion of the pad oxide layer is removed by a process of forming the second recess.

12. The manufacturing method of the semiconductor device according to claim 1, further comprising:
    forming a first isolation structure in the first region of the semiconductor substrate; and
    forming a second isolation structure in the second region of the semiconductor substrate, wherein the first isolation structure comprises a protruding part extending downwards, and the protruding part is lower than a bottom surface of the second isolation structure in the vertical direction.

13. The manufacturing method of the semiconductor device according to claim 12, wherein the first isolation structure is directly connected with the first gate oxide layer, and the second isolation structure is directly connected with the second gate oxide layer.

14. The manufacturing method of the semiconductor device according to claim 12, wherein a part of the first isolation structure and a part of the second isolation structure are removed by the removing process.

15. The manufacturing method of the semiconductor device according to claim 12, further comprising:
   forming a patterned mask layer on the semiconductor substrate before the removing process, wherein the first gate oxide layer, a part of the first isolation structure, and a part of the second isolation structure are covered by the patterned mask layer during the removing process.

16. The manufacturing method of the semiconductor device according to claim 1, wherein a portion of the second gate oxide layer is formed outside the second recess and removed by the removing process.

17. The manufacturing method of the semiconductor device according to claim 1, wherein the removing process comprises a dry etching step and a wet etching step performed after the dry etching step.

* * * * *